US006177813B1

United States Patent
Kim

(10) Patent No.: US 6,177,813 B1
(45) Date of Patent: Jan. 23, 2001

(54) LOW FREQUENCY DETECTION CIRCUIT

(75) Inventor: Ju Han Kim, Suwon (KR)

(73) Assignee: Hyundai Electronics Industries Co., Ltd., Ichon (KR)

( * ) Notice: Under 35 U.S.C. 154(b), the term of this patent shall be extended for 0 days.

(21) Appl. No.: 09/311,588

(22) Filed: May 14, 1999

(30) Foreign Application Priority Data

Sep. 25, 1998 (KR) .................................................. 98-40011

(51) Int. Cl.[7] ....................................................... H03K 9/06
(52) U.S. Cl. ................................................. 327/49; 327/43
(58) Field of Search ................................. 327/39–44, 45, 327/46, 47, 49, 276–278, 284, 293, 299, 407, 99

(56) References Cited

U.S. PATENT DOCUMENTS

| 4,618,787 | * | 10/1986 | Jacksier et al. ....................... 327/277 |
| 5,440,592 | * | 8/1995 | Ellis et al. ........................... 375/354 |
| 5,818,890 | * | 10/1998 | Ford et al. ........................... 375/371 |
| 6,025,744 | * | 2/2000 | Bertolet et al. ....................... 327/276 |
| 6,025,745 | * | 2/2000 | Lee et al. ............................ 327/277 |

* cited by examiner

Primary Examiner—My-Trang Nu Ton
(74) Attorney, Agent, or Firm—Fleshner & Kim, LLP

(57) ABSTRACT

An improved low frequency detection circuit is disclosed. The low frequency detection circuit employs as an internal clock signal of the system the negative delay signal CK1 generated in accordance with the negative delay signal generator when the externally applied clock signal is in high frequency, and the externally applied clock signal can be employed as an internal clock signal of the system when it is in low frequency, thereby simplifying and miniaturizing a required circuit. The circuit includes a negative delay signal generator for receiving an input signal and outputting a negative delay signal and a plurality of low frequency detection signals, a low frequency detector for receiving the plurality of low frequency detection signals and outputting a flag signal, and a signal selector for outputting one selected from the input signal and the negative delay signal in accordance with the flag signal.

20 Claims, 5 Drawing Sheets

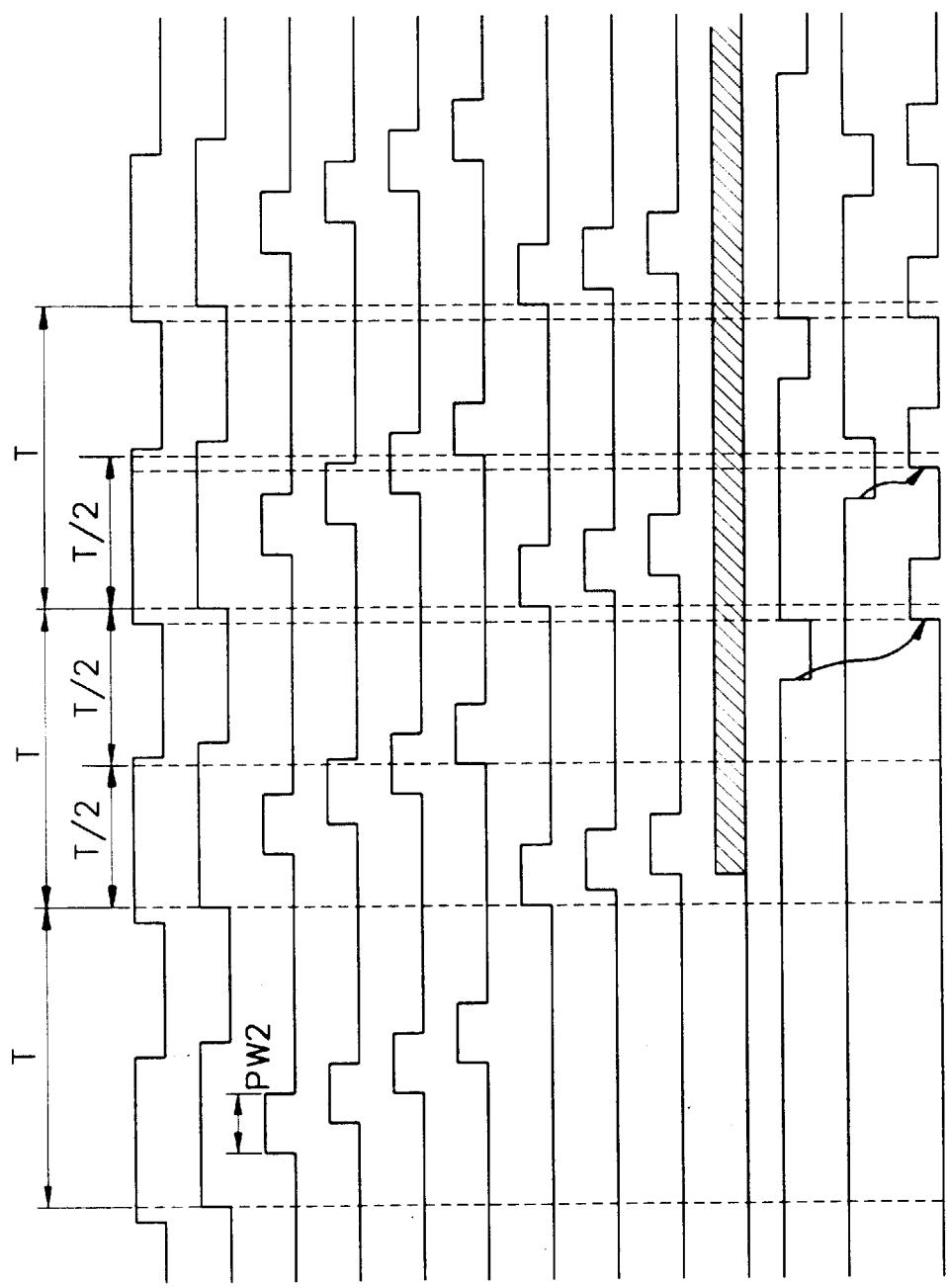

LOW FREQUENCY DETECTION CIRCUIT

BACKGROUND OF THE INVENTION

1. Field of the Invention

The present invention relates to a low frequency detection circuit, and more particularly, to an improved low frequency detection circuit, wherein a delay locked loop circuit for a semiconductor memory being operated at a high frequency can also be operated at a low frequency.

2. Description of the Background Art

The composition of a conventional sub-delay generation circuit will now be described with reference to the accompanying drawings.

FIG. 1 shows a negative delay signal generation circuit according to the conventional art. As shown therein, the circuit includes a pulse generator 10 for receiving an externally applied clock signal CK and generating a one shot pulse signal S1, a delay array 11 for receiving the one shot pulse signal S1 and outputting a delayed one shot pulse signal S2, a forward delay array 12 for receiving the delayed one shot pulse signal S2 and outputting a plurality of delay signals DS1–DS6, a mirror control circuit 13 for receiving the plurality of delay signals DS1–DS6 and outputting a plurality of locking signals S3–S8 in accordance with the one shot pulse signal S1, a backward delay array 14 for receiving the plurality of locking signals S3–S8 and outputting sequentially delayed output signals DS7–DS12, a dummy delay array 15 for receiving the output signals DS7–DS12 of the backward delay array 14 and decreasing power of the output signals DS7–DS12, and a delay array 16 for receiving and delaying the output signal DS12 of the backward delay array 14 and outputting a negative delay signal CKO.

Here, the negative delay signal generation circuit will now be explained in further detail.

The pulse generator 10 includes an inverter 11 for inverting a clock signal CK, a NAND gate ND1 for NANDing the clock signal CK and the output signal of the inverter I1, and an inverter I2 for inverting an output signal of the NAND gate ND1 and outputting a one shot pulse signal S1.

The delay array 11 includes inverters I3, I4 and buffers B1, B2 which are serially connected and for receiving and delaying the one shot pulse signal S1.

The forward delay array 12 includes a plurality of delay arrays D1–D6 serially connected with each other and for receiving the delayed one shot pulse signal S2 and respectively outputting the delayed one shot pulse signals DS1–DS6. Here, the delay array D1 includes a NAND gate ND2 for NANDing the delayed one shot pulse signal S2 and the source voltage Vcc, and an inverter 15 for inverting the output signal of the NAND gate ND2. Also, the other delay arrays D2–D6 are provided in the same as the delay array D1 in composition.

The mirror control circuit 13 includes a plurality of NAND gates ND3–ND8 for NANDing the output signals DS1–DS6 of the forward delay circuit 12 and the one shot pulse signal Si.

The backward delay circuit 14 includes a plurality of delay arrays D7–D12 for receiving a plurality of locking signals S30S8 outputted from the mirror control circuit 13 and sequentially delaying the received values. Here, the delay array D7 includes a NAND gate ND9 for NANDing the input signal S3 and the source voltage Vcc, and an inverter 16 for inverting the output signal of the NAND gate ND9. The other delay arrays D8–D12 is also composed of the same as the delay array D7 in circuit device composition.

The dummy delay array 15 is composed of a plurality of NAND gates ND10A–ND10F for respectively NANDing the plurality of locking signals DS7–DS12 and the ground voltage Vss.

The delay array 16 includes inverters 17, 18 serially connected to each other to delay the output signal DS12 of the backward delay circuit 14.

The operation of the conventional negative delay signal generation circuit will now be explained with reference to FIGS. 2A through 2G.

The pulse generator 10 which has received a clock signal CK as shown in FIG. 2A, generates the one shot pulse signal S1 delayed by time period t1 and having pulse width PW1, as shown in FIG. 2B, and outputs the generated value to the delay array 11 and the mirror control circuit 13. The delay array 11 which has received the one shot pulse signal S1, as shown in FIG. 2C, delays the received value by time period t2 and outputs the one shot pulse signal S2 to the forward delay circuit 12. The plurality of serially connected delay arrays D1–D6 in the forward delay circuit 12 which receives the delayed one shot pulse signal S2 respectively delay the delayed one shot pulse signal S2 and accordingly output a plurality of output signals DS1–DS6. Then, the NAND gate ND13 of the mirror control circuit 13 NANDs the signal DS6 outputted from the delay array D6 after being delayed by t3 of the signal S2 as show in FIG. 2D, and the one shot pulse signal S1 after the time period t2+t3 lapses further than the previous one shot pulse signal as shown in FIG. 2B, and then outputs the locked signal S3 as shown in FIG. 2E. Then, the backward delay circuit 14 sequentially delays the output signal locked in the mirror control circuit 13, and outputs the delayed locking signal DS12 as shown in FIG. 2F.

The second delay array 16 receiving the delayed locking signal DS12, as show in FIG. 2G, delays the output signal of the mirror control circuit 13 by time period t4, and delays the delayed locking signal DS12 before the third clock signal CK of the clock signal CK is outputted and then outputs the negative delay signal CKO.

The conventional negative delay signal generation circuit as described above may utilize the negative signal generated by receiving the clock signal as a system internal clock signal when the input signal is in a high frequency. However, the conventional negative delay signal generation circuit disadvantageously fails to output a negative delay signal because the mirror control circuit 13 for receiving the output signal of the forward delay circuit and the one shot pulse signal outputted from the pulse generator causes timing skew for thereby being unable to output a locked signal to the backward delay circuit.

Therefore, an additional circuit should be provided in order to test a semiconductor chip operation in a low frequency by use of the conventional negative delay signal generation circuit, thereby incurring an increased circuit size and complication.

SUMMARY OF THE INVENTION

The present invention is directed to overcoming the conventional disadvantages.

Therefore, it is an object of the present invention to provide a low frequency detection circuit for using a negative delay signal as a system internal clock signal when a clock signal is in high frequency, and using the clock signal as a system internal clock signal when the clock signal is in low frequency.

To achieve the above-described object, there is provided a low frequency detection circuit according to the present invention which includes a negative delay signal generator for receiving an input signal and outputting a negative delay signal and a plurality of low frequency detection signals, a low frequency detector for receiving the plurality of low frequency detection signals and outputting a flag signal, and a signal selector for outputting one selected from the input signal and the negative delay signal in accordance with the flag signal.

The object and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein:

FIGS. 5A through 5M are timing diagrams illustrating negative delay signals and flag signals according to the present invention.

DETAILED DESCRIPTION OF THE PREFERRED EMBODIMENTS

The composition of the present invention will now be described with reference to the accompanying drawings.

Figure 1:
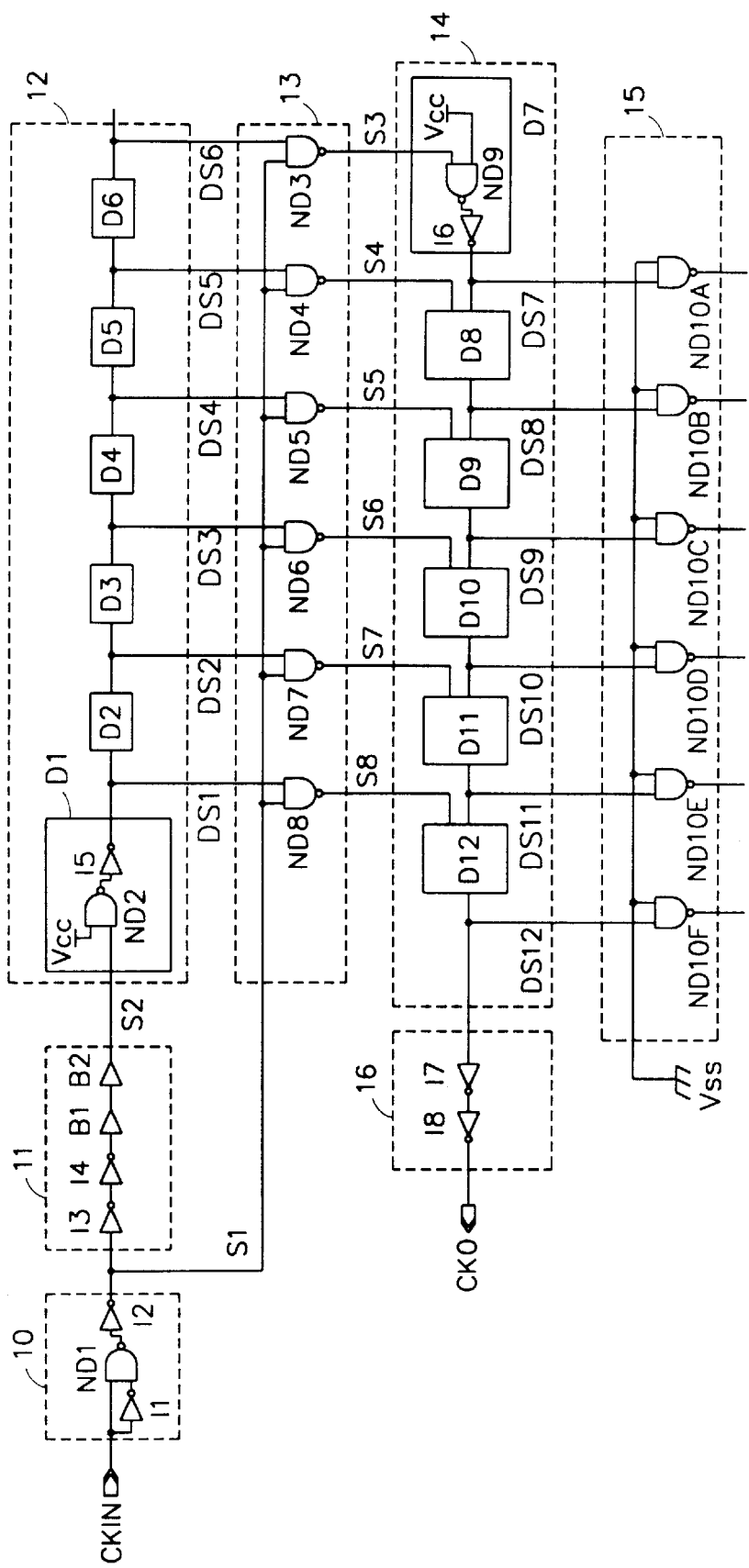
FIG. 1 is a circuit view illustrating a conventional negative delay signal generation circuit.
Figure 2:
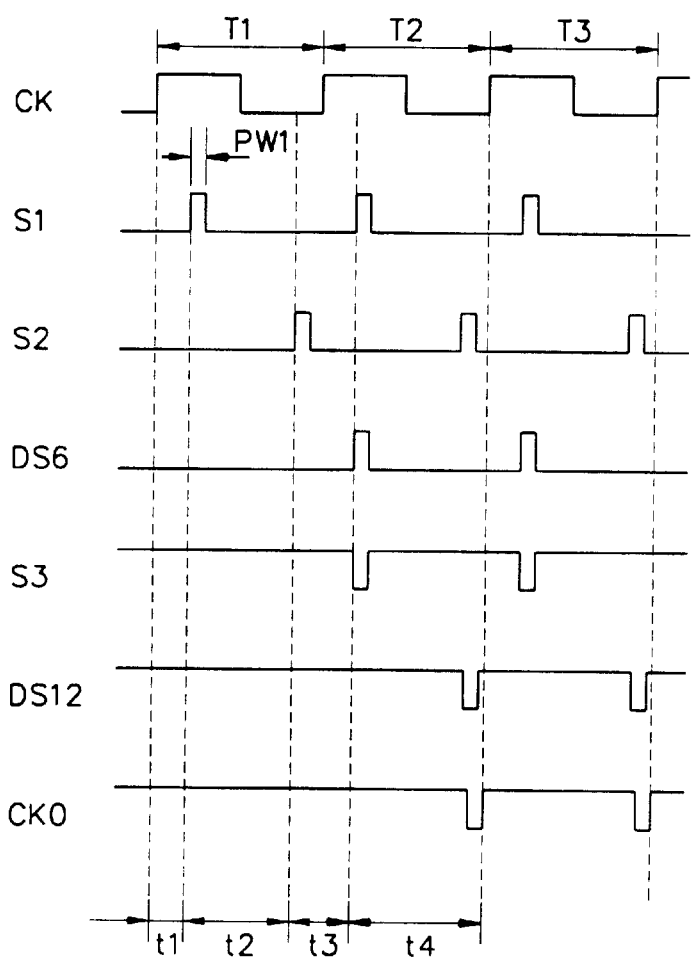
FIGS. 2A through 2G are timing diagrams illustrating respective signals in the circuit of FIG. 1.
Figure 3:
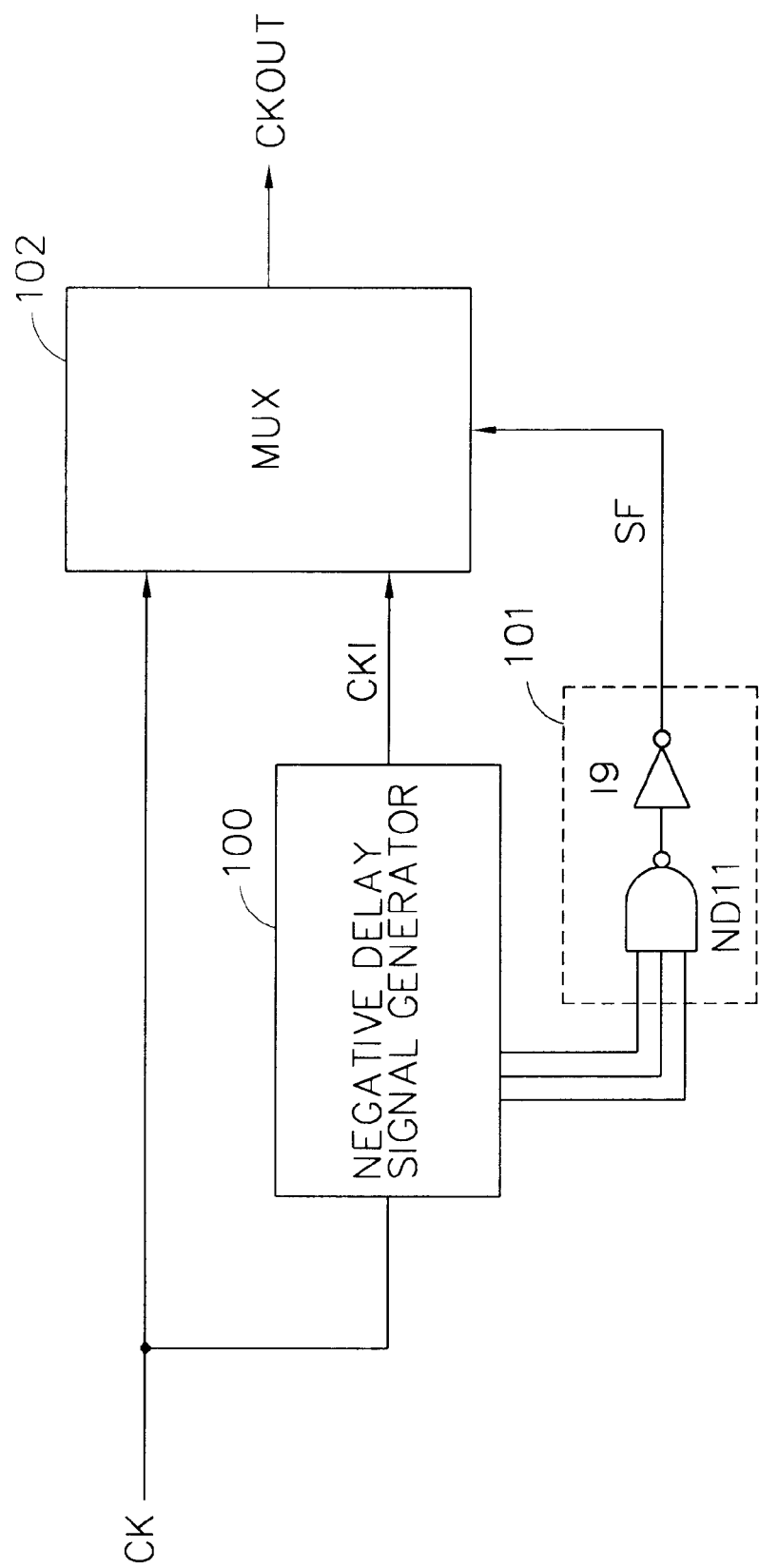
FIG. 3 is a circuit view illustrating a negative delay signal generation circuit according to the present invention.

FIG. 3 is a circuit view of a low frequency detection circuit according to the present invention. As shown therein, the low frequency detection circuit includes a negative delay signal generator 100 for receiving a clock signal CK and outputting a negative delay signal CK1 and low frequency detection signals NDA1–NDA7, a low frequency detector 101 for receiving the low frequency detection signals NDAS1–NDAS7 and outputting a flag signal SF, and a multiplexer 102 for outputting the clock signal CK and the negative delay signal CK1 in accordance with the flag signal SF.

Figure 4:
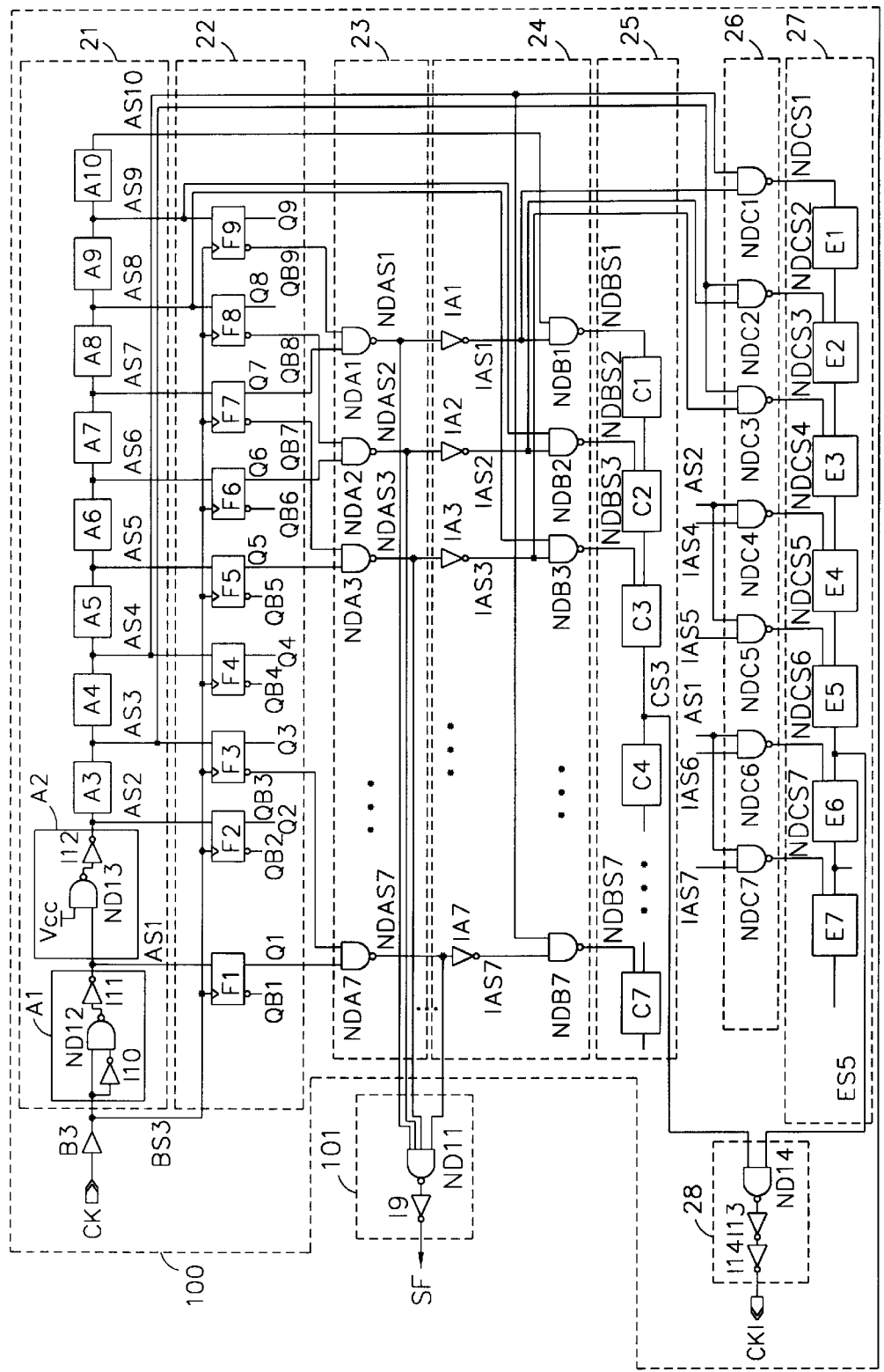
FIG. 4 is a circuit view detailing a negative delay signal generator and a low frequency detector in the circuit of FIG. 3.

FIG. 4 is a detailed view of the negative delay signal generator and the low frequency detector in FIG. 3. As shown therein, the negative delay signal generator 100 includes a buffer B3 for delaying the clock signal CK and outputting a delay signal BS3 to a forward delay array 21 and a latch unit 22, the forward delay array 21 for receiving the delay signal BS3 and outputting the one shot pulse signals AS1–AS10, the latch unit 22 for receiving the one shot pulse signals AS1–AS10 and outputting the latch signals Q1–Q9, QB1–QB9 in accordance with the delay signal BS3, a first logic operator 23 for receiving the latch signals Q1–Q9, QB1–QB9 and outputting the low frequency detection signals NDAS1–NDAS7, a second logic operator 24 for receiving the low frequency detection signals NDAS1–NDAS7 and the one shot pulse signals AS4–AS10 and outputting first locking signals NDBS1–NDBS7 and inverted low frequency detection signals IAS1–IAS7, a third logic operator 26 for receiving the inverted low frequency detection signals IAS1–IAS7 and the one shot pulse signals AS1–AS4 and outputting the second locking signals NDCS1–NDCS7, a half wave backward delay array 27 for receiving and delaying the second locking signals NDCS1–NDSC7, and a delay array 28 for receiving an output signal CS3 of the full wave backward delay array 25 and an output signal E5 of the half wave backward delay array 27 and outputting the negative delay signal CK1.

The respective blocks of the negative delay signal generator will now be explained in further detail.

The full half delay array 21 includes serially connected one shot pulse signal generator A1 and a plurality of delay arrays A2–A10. Here, the one shot pulse signal generator A1 and the delay arrays A2–A10 are the same as the conventional art and their explanation will be omitted accordingly.

The latch unit 22 includes a plurality of D-type flip-flops F1–F9.

The first logic operator 23 includes NAND gates NDA1–NDA7 for NANDing the positive latch signals Q1–Q9 and the negative latch signals QB3–QB9 and outputting the low frequency detection signals NDAS1–NDAS7.

The second logic operator 24 includes a plurality of inverters IA1–IA7 for receiving the low frequency detection signals NDAS–NDAS7 and outputting the inverted low frequency detection signals IAS1–IAS7, and NAND gates NDB1–NDB7 for NANDing the inverted low frequency detection signals IAS1–IAS7 and the one shot pulse signals AS4–AS10.

The full wave backward delay array 25 includes delay arrays C1–C7 for receiving and sequentially delaying the first locking signals NDBS1–NDBS7 of the second logic operator 24.

The third logic operator 26 includes NAND gates NDC1–NDC7 for NANDing the one shot pulse signals AS1–AS4 and the inverted low frequency detection signals IAS1–IAS7.

The half wave backward delay array 27 includes a plurality of delay arrays E1–E7 for sequentially delaying the second locking signals NDCS1–NDCS7 of the third logic operator 26.

The delay array 28 includes a NAND gate ND14 for NANDing an output signal CS3 of the full wave backward delay array 25 and an output signal ES5 of the half wave backward delay array 26, and serially connected inverters 113, 114 for delaying an output signal of the NAND gate ND14.

Here, the respective delay arrays C1–C7, E1–E7 includes in the full wave backward delay array 25 and the half wave backward delay array 27 are arrayed in the same way as the delay arrays A2–A10 included in the full half delay array 21.

The low frequency detector 101 includes a NAND gate ND11 for NANDing the low frequency detection signals NDAS1–NDAS7, and an inverter 19 for inverting an output signal of the NAND gate ND11.

The operation of the low frequency detection circuit according to the present invention will now be described.

The buffer B3 for receiving the clock signal CK as shown in FIG. 5A outputs a delay signal BS3 delayed for a predetermined time. The forward delay array 21, as shown in FIG. 5C, generates a one shot pulse signal AS1 having a pulse width as large as PW2, and outputs the sequentially delayed one shot pulse signal AS2–AS10, as shown in FIGS. 5D–5I. Here, one cycle of the delay signal BS3 incudes the delayed eight one-shot pulse signals AS1–AS8. Therefore, the delayed four one-shot signals AS1–AS4 remain in ½ cycle of the delay signal.

At this time, the latch unit 22 for receiving the one shot pulse signals AS1–AS10 intermittently outputted from the forward delay array 21 outputs the negative and positive latching signals Q1–Q9, QB1–QB9 in accordance with the delayed delay signal BS3. Then, the positive latch signals Q1–Q9 and the negative latch signals QB1–QB9 delayed twice further than the positive latch signals are logically operated by the first logic operator 23 which outputs all the low frequency detection signals NDAS1–NDAS7 in low level state.

Therefore, the low frequency detector 101 for receiving all the low level low frequency detection signals NDAS1–NDAS7 outputs a low level flag signal SF. Then, the selection delay array 102 which has received the flag signal outputs the subsequently generated negative signal so that the negative delay signal can be employed as an internal clock signal in the system.

Meanwhile, when the first logic operator 23 for logically operating the positive latch signals Q1–Q9 and the negative latch signals QB–QB9 delayed twice further than the positive latch signals outputs all the low frequency detection signals NDAS1–NDAS7 in high level state, the low frequency detector 101 for receiving all the high level state low frequency detection signals NDAS1–NDAS7, as shown in FIG. 5J, outputs a high level flag signal SF, whereby the selection delay array 102 for receiving the high flag signal SF enables the system to employ the clock signal as an internal clock signal.

Here, the generation process of the negative delay signal will now be explained.

The second logic operator 24 and the third logic operator for receiving the inverted low frequency detection signals IAS1–IAS7 outputted from the first logic operator 23 logically operate the delayed one shot pulse signals AS1–AS10 outputted from the forward delay array 21 to thereby determine the output signals, respectively.

At this time, as shown in FIG. 5K, the locking signal CS3 outputted from the second logic operator 24, as shown in FIG. 5L, has ½ cycle time difference of the clock signal CK and the delay signal BS3 from the locking signal ES5 outputted from the third logic operator 26.

That is, the output signal CS3 of the full wave backward delay array 25 denotes a one shot pulse signal AS8 which is generated within one cycle of the delay signal BS3 and which has passed through the five delay array units A9, A10, C1, C2. The output signal ES5 of the half wave backward delay array 27 denotes a one shot pulse signal AS4 which is generated within ½ cycle of the delay signal BS3 and which has passed through the five delay array units E1–E5. Therefore, the output signals CS3 and ES5 are outputted by the time difference of ½ cycle of the delay signal BS3.

Therefore, the fourth logic operator 28 for receiving the output signals CS3, CS5 outputs the negative signal CK1, as shown in FIG. 4M.

As described above, the low frequency detection circuit according to the present invention employs as an internal clock signal of the system the negative delay signal CK1 generated in accordance with the negative delay signal generator 100 when the externally applied clock signal is in high frequency, and the externally applied clock signal CK can be employed as an internal clock signal of the system when it is in low frequency, thereby simplifying and miniaturizing a required circuit.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A low frequency detection circuit, comprising:

a negative delay signal generator for receiving an input signal (CK) and outputting a negative delay signal (CK1) and a plurality of low frequency detection signals (NDAS1–NDAS7);

a low frequency detector for receiving the plurality of low frequency detection signals (NDAS1–NDAS7) and outputting a flag signal (SF); and a signal selector for outputting one selected from the input signal (CK) and the negative delay signal (CK1) in accordance with the flag signal (SF), wherein the negative delay signal generator comprises, a first delay unit for receiving the input signal (CK) and outputting a plurality of one shot pulse signals (AS2–AS10) respectively having a predetermined pulse width, a latch unit for receiving and latching the plurality of one shot pulse signals (AS1–AS10) in accordance with the input signal (CK), a first circuit for logically operating output signals of the latch unit and outputting the low frequency detection signals (NDAS1–NDAS7), a second circuit for receiving the low frequency detection signals (NDAS1–NDAS7) and outputting inverted low frequency detection signals (IAS1–IAS7) and wherein the second circuit further processes the inverted low frequency detection signals (IAS1–IAS7) and one shot pulse signals (AS4–AS10) to generate and delay first locking signals, a third circuit for logically operating the inverted low frequency detection signals (IAS1–IAS7) and the delayed one shot pulse signals (AS4, AS3, AS3, AS2 AS2, AS1, AS1), respectively to generate and delay second locking signals, and a fourth circuit for receiving and logically operating delayed locking signals of the second circuit and the third circuit, and outputting the negative delay signal.

2. The circuit of claim 1, wherein the first circuit comprises a first logic operator, wherein the second circuit comprises:

a second logic operator for receiving the low frequency detection signals (NDAS1–NDAS7) and outputting the inverted low frequency detection signals (IAS1–IAS7) and outputting first locking signals (NDBS1–NDBS7) by logically operating the low frequency detection signals (NDAS1–NDAS7) and one shot pulse signals (AS4–AS10); and a second delay unit for respectively receiving and sequentially delaying the first locking signals (NDBS1–NDBS7) wherein the third circuit comprises, a third logic operator for logically operating the inverted low frequency detection signals (IAS1–IAS7) and the delayed one shot pulse signals (AS4, AS3, AS3, AS2, AS2, AS1, AS1), respectively, to generate second locking signals (NDCS1–NDCS7), and a third delay unit for receiving and sequentially delaying the second locking signals (NDCS1–NDCS7), and wherein the fourth circuit comprises a fourth logic operator.

3. The circuit of claim 2, wherein the first delay unit comprises:

a one shot pulse generator (A1) for receiving the input signal and generating a one shot pulse signal having a predetermined pulse width; and a plurality of serially connected delay units (A1–A10) for outputting the delayed one shot pulse signals (AS2–AS10).

4. The circuit of claim 2, wherein the latch unit comprises a plurality of D-type flip-flops.

5. The circuit of claim 2, wherein the first logic operator comprises a plurality of NAND gates.

6. The circuit of claim 2, wherein the second logic operator comprises:

a plurality of inverters (IA1–IA7) for receiving the low frequency detection signals (NDAS1–NDAS7) and outputting the inverted low frequency detection signals (IAS1–IAS7); and a plurality of NAND gates (NDB1–NDB7) for logically operating the inverted low frequency detection signals (IAS1–IAS7) and the one shot pulse signals (AS4–AS10) delayed within ½ cycle time period of the input signal, and outputting the first locking signals (NDBS1–NDBS7).

7. The circuit of claim 2, wherein the second delay unit comprises a plurality of delay means for receiving and delaying for a predetermined time the first locking signals.

8. The circuit of claim 7, wherein the plurality of delay means are serially connected.

9. The circuit of claim 2, wherein the third logic operator comprises a plurality of NAND gates for logically operating the inverted low frequency detection signals and the one shot pulse signals (AS4–AS10) delayed within ½ cycle time period of the input signal, and outputting the second locking signals.

10. The circuit of claim 2, wherein the first and second locking signals are same signal wave forms.

11. The circuit of claim 2, wherein the third delay unit comprises a plurality of delay means for receiving and delaying for a predetermined time the second locking signals.

12. The circuit of claim 11, wherein the plurality of delay means are serially connected.

13. The circuit of claim 2, wherein the fourth logic operator comprises:

a NAND gate for NANDing a first output signal of the second delay unit and a first output signal of the third delay unit; and a plurality of inverters for inverting the NAND gate and outputting the negative delay signal.

14. The circuit of claim 13, wherein the first and second output signals are outputted ½ cycle time period of the input signal.

15. The circuit of claim 1, wherein the low frequency detector outputs a low level flag signal when the input signal is in high frequency, and the signal selector which has received the low level flag signal outputs the negative delay signal.

16. The circuit of claim 1, wherein the low frequency detector outputs a high level flag signal when the input signal is in low frequency, and the signal selector which has received the high level flag signal outputs the negative delay signal.

17. The circuit of claim 1, wherein the low frequency detector comprises a NAND gate for logically operating the low frequency detection signals.

18. The circuit of claim 1, wherein the negative delay signal (CK1) is outputted prior to the input signal and twice the frequency of the input signal.

19. A low frequency detection circuit, comprising:

a negative delay signal generator that receives an input signal and outputs a negative delay signal and a plurality of first detection signals, wherein the negative delay signal generator comprises, a latch circuit that receives the input signal to generate and latch a plurality of one shot pulse signals in accordance with the input signal, a first circuit that logically operates output signals of the latch unit and outputs the first detection signals, a second circuit that logically operates the first detection signals and a first subset of the one shot pulse signals to output second detection signals and delayed first locking signals, a third circuit that logically operates the second detection signals and a second subset of the one shot pulse signals, respectively, to generate and delay second locking signals, and a fourth circuit that logically operates the first locking signals and the second locking signals and outputs the negative delay signal;

a detector that receives the plurality of first detection signals and outputs a control signal; and a selector that outputs one selected from the input signal and the negative delay signal in accordance with the control signal.

20. The circuit of claim 19, wherein the first circuit comprises a first logic operator, wherein the second circuit comprises:

a second logic operator that logically operates the first detection signals to output the second detection signals that are inverted first detection signals and logically operates the first detection signals and the first subset of the one shot pulse signals to output the first locking signals; and a first delay unit that respectively receives and sequentially delays the first locking signals, wherein the third circuit comprises, a third logic operator that logically operates the inverted first detection signals and the second subset of the one shot pulse signals, respectively, to generate the second locking signals, and a third delay unit that receives and sequentially delays the second locking signals, and wherein the fourth circuit comprises a first logic gate and a plurality of inverters.

* * * * *